United States Patent

Itokawa

(10) Patent No.: US 9,018,061 B2
(45) Date of Patent: Apr. 28, 2015

(54) SEMICONDUCTOR MEMORY DEVICE AND METHOD FOR MANUFACTURING THE SAME

(71) Applicant: Kabushiki Kaisha Toshiba, Minato-ku (JP)

(72) Inventor: Hiroshi Itokawa, Oita-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/153,384

(22) Filed: Jan. 13, 2014

(65) Prior Publication Data

US 2015/0060982 A1 Mar. 5, 2015

Related U.S. Application Data

(60) Provisional application No. 61/872,031, filed on Aug. 30, 2013.

(51) Int. Cl.
| | | |
|---|---|---|
| *H01L 21/336* | (2006.01) | |
| *H01L 29/423* | (2006.01) | |
| *H01L 29/788* | (2006.01) | |
| *H01L 21/28* | (2006.01) | |

(52) U.S. Cl.
CPC ........ *H01L 29/42324* (2013.01); *H01L 29/788* (2013.01); *H01L 21/28273* (2013.01)

(58) Field of Classification Search
None
See application file for complete search history.

(56) References Cited

U.S. PATENT DOCUMENTS

| | | | |
|---|---|---|---|
| 7,463,530 B2 * | 12/2008 | Lue et al. | 365/185.24 |
| 2006/0017092 A1 * | 1/2006 | Dong et al. | 257/314 |
| 2008/0157181 A1 | 7/2008 | Kim et al. | |
| 2008/0233762 A1 | 9/2008 | Hong | |
| 2009/0140317 A1 | 6/2009 | Rosmeulen | |
| 2010/0244157 A1 * | 9/2010 | Hirano et al. | 257/411 |
| 2012/0025297 A1 | 2/2012 | Takashima et al. | |

* cited by examiner

*Primary Examiner* — Evan Pert
*Assistant Examiner* — Herve Assouman
(74) *Attorney, Agent, or Firm* — Oblon, McClelland, Maier & Neustadt, L.L.P.

(57) ABSTRACT

A semiconductor memory device according to an embodiment, includes a semiconductor substrate, a first insulating film provided on the semiconductor substrate, a silicon film including silicon provided on the first insulating film, a second insulating film provided on the silicon film, a hafnium alloy-containing film provided on the second insulating film, the hafnium alloy-containing film including oxygen and an alloy of hafnium and a metal other than hafnium, a third insulating film provided on the hafnium alloy-containing film, and an electrode provided on the third insulating film.

7 Claims, 7 Drawing Sheets

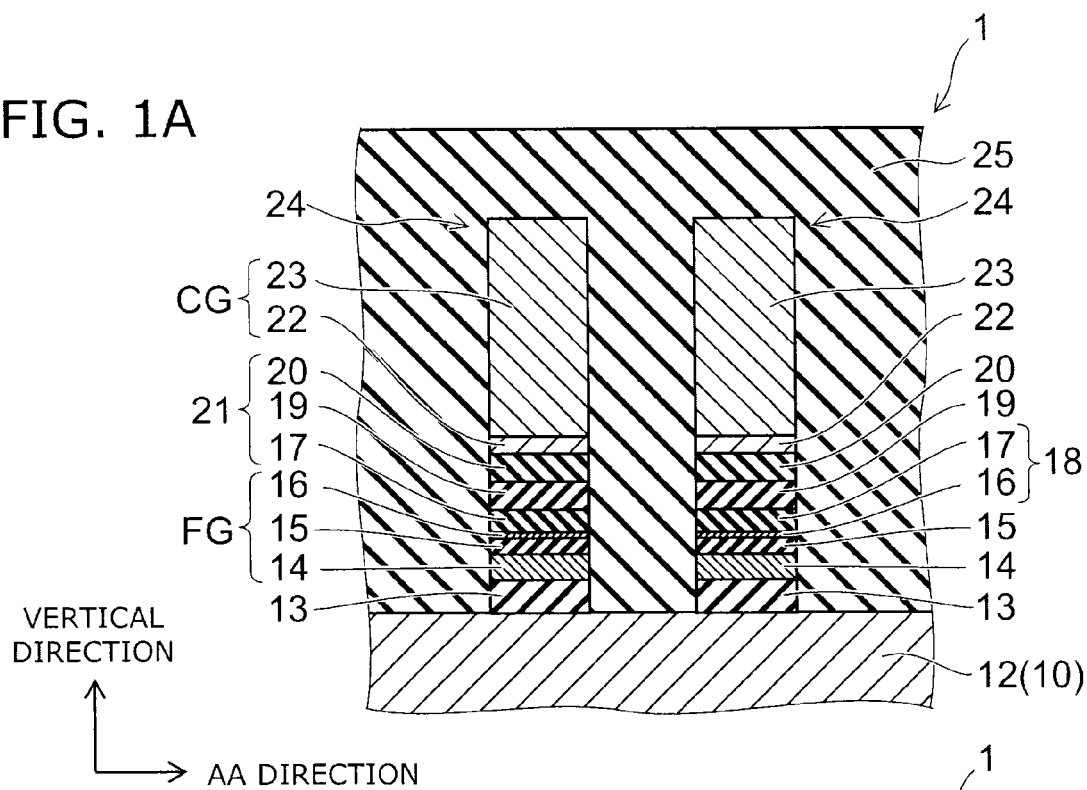
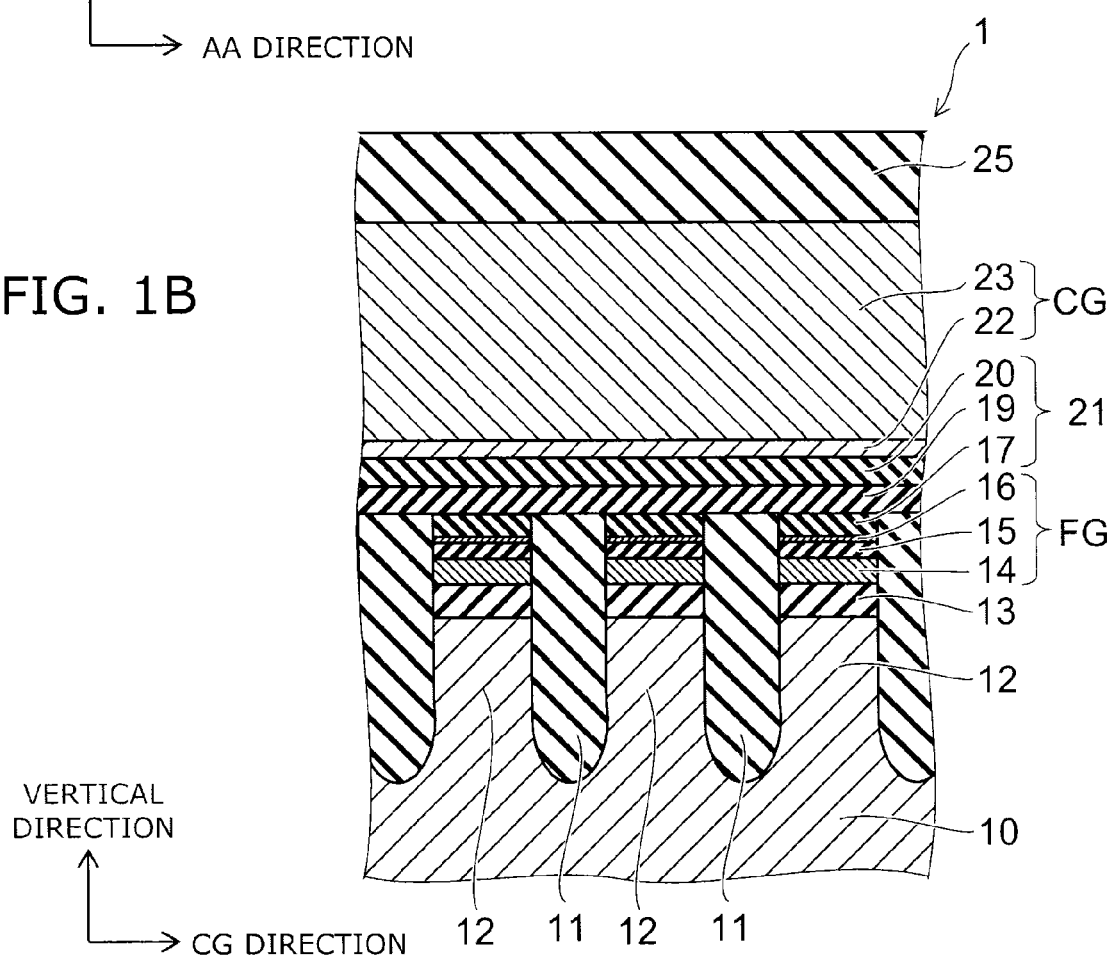

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 61/872,031, filed on Aug. 30, 2013; the entire contents of which are incorporated herein by reference.

FIELD

Embodiments described herein relate generally to a semiconductor memory device and a method for manufacturing the same.

BACKGROUND

Conventionally, NAND flash memory has been developed as a semiconductor memory device. As NAND flash memory is shrunk, charge retention characteristics of the floating gate electrode degrade. Therefore, to compensate this, technology has been proposed to improve the charge retention characteristics by forming the upper portion of the floating gate electrode from a metal to increase the bandgap between the upper portion of the floating gate electrode and the insulating film that is interposed between the upper portion of the floating gate electrode and the control gate electrode.

BRIEF DESCRIPTION OF THE DRAWINGS

FIG. 1A and FIG. 1B are cross-sectional views showing a semiconductor memory device according to an embodiment;

DETAILED DESCRIPTION

Figure 2A:
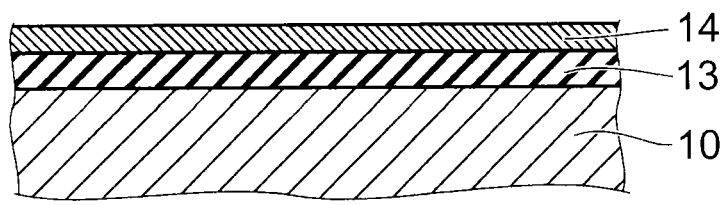
FIG. 2A to FIG. 3B are cross-sectional views of processes, showing a method for manufacturing the semiconductor memory device according to the embodiment.

A semiconductor memory device according to an embodiment, includes a semiconductor substrate, a first insulating film provided on the semiconductor substrate, a silicon film including silicon provided on the first insulating film, a second insulating film provided on the silicon film, a hafnium alloy-containing film provided on the second insulating film, the hafnium alloy-containing film including oxygen and an alloy of hafnium and a metal other than hafnium, a third insulating film provided on the hafnium alloy-containing film, and an electrode provided on the third insulating film.

A method for manufacturing a semiconductor memory device according to an embodiment, includes forming a first insulating film on a semiconductor substrate, forming a silicon film including silicon on the first insulating film, forming a second insulating film on the silicon film, forming a metal film on the second insulating film by depositing a metal other than hafnium, depositing hafnium and oxygen on the metal film, forming a hafnium alloy-containing film by alloying the metal and the hafnium by performing heat treatment, forming a third insulating film on the hafnium alloy-containing film, and forming an electrode on the third insulating film.

Embodiments of the invention will now be described with reference to the drawings.

FIG. 1A and FIG. 1B are cross-sectional views showing a semiconductor memory device according to the embodiment.

As shown in FIG. 1A and FIG. 1B, the semiconductor memory device 1 according to the embodiment is NAND flash memory.

In the semiconductor memory device 1, a silicon substrate 10 is provided; and multiple shallow trench isolations (STIs) 11 are formed in the upper surface of the silicon substrate 10. The STIs 11 extend in one direction (hereinbelow called the "AA direction") parallel to the upper surface of the silicon substrate 10 to partition the upper portion of the silicon substrate 10 into multiple active areas 12.

A tunneling insulating film 13 is provided in the regions directly above the active areas 12. The tunneling insulating film 13 is a film that is made of, for example, silicon oxide ($SiO_2$), is normally insulative, and allows a tunneling current to flow when a prescribed voltage within the range of the drive voltage of the semiconductor memory device 1 is applied. The tunneling insulating film 13 is provided intermittently in the AA direction.

A silicon film 14 that is made of polycrystalline silicon (Si) is provided on the tunneling insulating film 13. An insulating film (IFD) 15 made of, for example, silicon nitride ($Si_3N_4$) is provided on the silicon film 14. An alloy film 16 having a hafnium-ruthenium alloy (HfRu alloy) as the main component is provided on the insulating film 15. The crystal structure of the hafnium-ruthenium alloy is a cubic structure.

A hafnium oxide film 17 having hafnium oxide ($HfO_2$) as the main component is provided on the alloy film 16. A hafnium alloy-containing film 18 including ruthenium (Ru), hafnium (Hf), and oxygen (O) is formed of the alloy film 16 and the hafnium oxide film 17. The proportion of hafnium to oxygen in the lower portion of the hafnium oxide film 17 is higher than that of the upper portion. A distinct interface does not necessarily exist between the alloy film 16 and the hafnium oxide film 17 inside the hafnium alloy-containing film 18; and there are cases where the composition changes continuously between the alloy film 16 and the hafnium oxide film 17.

A floating gate electrode FG is formed of the silicon film 14, the insulating film 15, and the alloy film 16. Multiple floating gate electrodes FG are provided on the silicon substrate 10 to be arranged in a matrix configuration along the AA direction and a direction (hereinbelow, called the "CG direction") orthogonal to the AA direction. The upper portions of the shallow trench isolations 11 are disposed in the spaces between the stacked bodies made of the floating gate electrode FG and the hafnium oxide film 17 in the CG direction.

A silicon oxide film 19 made of silicon oxide and a hafnium oxide film 20 made of hafnium oxide are stacked in this order above the hafnium oxide film 17 and the shallow trench isolation 11. The silicon oxide film 19 and the hafnium oxide film 20 extend in the CG direction. An IPD (Inter Poly Dielectric) film 21 is formed of the hafnium oxide film 17, the silicon oxide film 19, and the hafnium oxide film 20. A barrier film 22 made of, for example, tantalum nitride (TaN) is provided on the IPD film 21; and a conductive film 23 made of, for example, tungsten (W) is provided on the barrier film 22. A control gate electrode CG that extends in the CG direction is formed of the barrier film 22 and the conductive film 23.

A gate stacked body 24 that extends in the CG direction is formed of the upper portion of the shallow trench isolation 11, the tunneling insulating film 13, the floating gate electrode FG, the IPD film 21, and the control gate electrode CG. The gate stacked body 24 is multiply provided on the silicon substrate 10. An inter-layer insulating film 25 that is made of, for example, silicon oxide is provided between the gate stacked bodies 24 and above the gate stacked bodies 24. An upper layer interconnect that includes a bit line (not shown) is provided on the inter-layer insulating film 25.

A method for manufacturing the semiconductor memory device according to the embodiment will now be described.

FIG. 2A to FIG. 3B are cross-sectional views of processes, showing the method for manufacturing the semiconductor memory device according to the embodiment.

First, as shown in FIG. 2A, the tunneling insulating film 13 made of, for example, silicon oxide is formed on the entire surface of the silicon substrate 10. Then, the silicon film 14 made of silicon is formed.

Figure 2B:
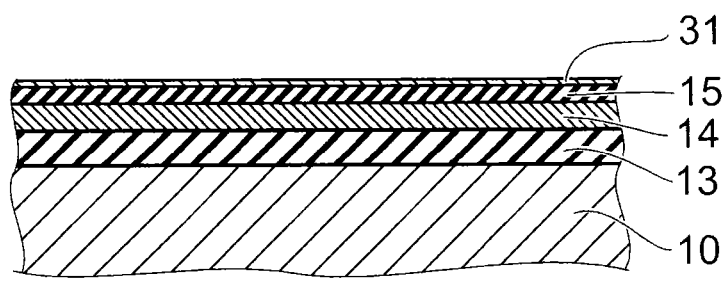

Then, as shown in FIG. 2B, the insulating film 15 made of, for example, silicon nitride is formed on the silicon film 14. Continuing, a ruthenium film 31 is formed by depositing ruthenium. The crystal structure of the simple ruthenium is a hexagonal structure.

Figure 2C:
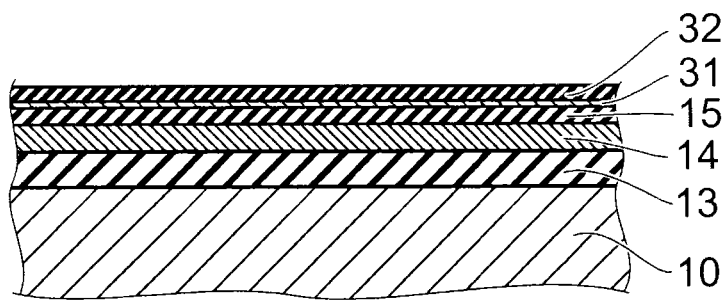

Then, as shown in FIG. 2C, a hafnium oxide film 32 is formed by depositing hafnium and oxygen by, for example, ALD (atomic layer deposition). At this time, the depositing of hafnium and oxygen includes multiply repeating a process of supplying a source-material gas of hafnium, e.g., hafnium carbide, hafnium nitride, etc., to an atmosphere inside the chamber of an ALD film formation apparatus and a process of evacuating the source-material gas of hafnium from the atmosphere; and subsequently supplying an oxidative gas, e.g., water vapor, to the atmosphere. Thereby, the hafnium atoms that are on the ruthenium film 31 can be deposited densely. The mechanism of this depositing method is described below.

Figure 3A:
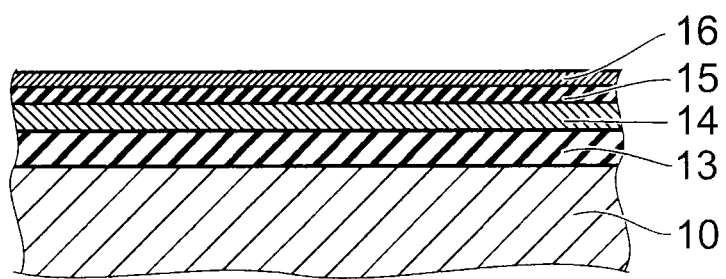

Continuing as shown in FIG. 3A, heat treatment for alloying is performed. The temperature of the heat treatment is, for example, a temperature not less than the crystallization temperature of hafnium. Thereby, the alloy film 16 that is made of a hafnium-ruthenium alloy (HfRu alloy) is formed by alloying the ruthenium included in the ruthenium film 31 (referring to FIG. 2C) with the hafnium included in the hafnium oxide film 32 (referring to FIG. 2C). The crystal structure of the ruthenium changes from the hexagonal structure into a cubic structure by being alloyed with the hafnium.

Figure 3B:
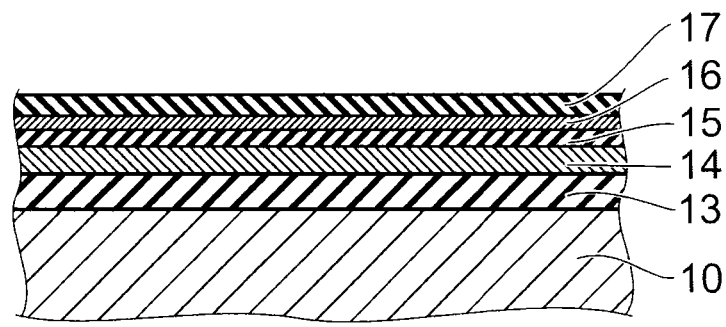

Then, as shown in FIG. 3B, the hafnium oxide film 17 is formed by depositing hafnium oxide. At this time, the proportion of hafnium to oxygen in the hafnium oxide film 17 is lower than the proportion of hafnium to oxygen in the hafnium oxide film 32. Also, the crystal grain boundaries at the interface between the hafnium oxide film 32 and the hafnium oxide film 17 become discontinuous. Hereinbelow, the hafnium oxide film 32 is referred to as a portion of the hafnium oxide film 17.

Continuing as shown in FIG. 1A and FIG. 1B, a hard mask (not shown) having a line-and-space configuration extending in the AA direction is formed on the hafnium oxide film 17. Then, anisotropic etching using the hard mask as a mask is performed to selectively remove the hafnium oxide film 17, the alloy film 16, the insulating film 15, the silicon film 14, and the tunneling insulating film 13 to divide the hafnium oxide film 17, the alloy film 16, the insulating film 15, the silicon film 14, and the tunneling insulating film 13 and make trenches extending in the AA direction in the upper portion of the silicon substrate 10. Then, the shallow trench isolations 11 are formed by, for example, depositing a silicon oxide film and performing etch-back. The lower portions of the shallow trench isolations 11 are filled into the trenches; and the upper portions of the shallow trench isolations 11 are disposed between the stacked bodies made of the tunneling insulating film 13, the silicon film 14, the insulating film 15, the alloy film 16, and the hafnium oxide film 17.

Then, the silicon oxide film 19, the hafnium oxide film 20, the barrier film 22, and the conductive film 23 are formed in this order above the hafnium oxide film 17 and the shallow trench isolation 11.

Continuing, a hard mask (not shown) having a line-and-space configuration extending in the CG direction is formed; and the conductive film 23, the barrier film 22, the hafnium oxide film 20, the silicon oxide film 19, the hafnium oxide film 17, the alloy film 16, the insulating film 15, the silicon film 14, the tunneling insulating film 13, and the upper portion of the shallow trench isolation 11 are selectively removed by performing anisotropic etching using the hard mask as a mask. Thereby, the multiple gate stacked bodies 24 extending in the CG direction are formed.

At this time, the stacked body made of the silicon film 14, the insulating film 15, and the alloy film 16 is divided along both the AA direction and the CG direction to form the multiple floating gate electrodes FG arranged in a matrix configuration. Also, the IPD film 21 is formed of the stacked body made of the hafnium oxide film 17, the silicon oxide film 19, and the hafnium oxide film 20. Further, the stacked body made of the barrier film 22 and the conductive film 23 is patterned into stripe configurations extending in the CG direction to form the control gate electrodes CG.

Then, the inter-layer insulating film 25 is formed between the gate stacked bodies 24 and above the gate stacked bodies by depositing silicon oxide on the entire surface and performing planarization. Continuing, the upper layer interconnect including the bit line (not shown) is formed on the inter-layer insulating film 25. Thus, the semiconductor memory device 1 according to the embodiment is manufactured.

Effects of the embodiment will now be described.

Figure 4:
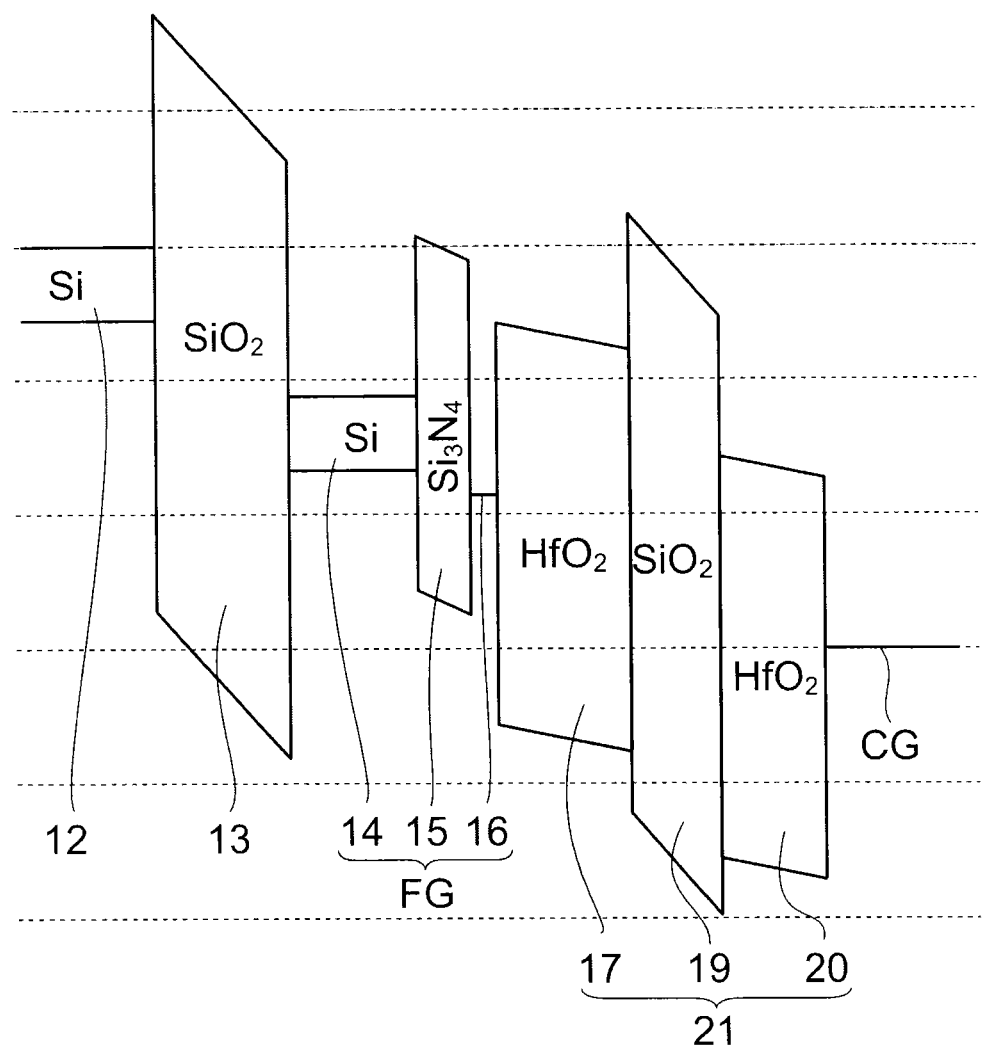
FIG. 4 is a bandgap diagram showing the operation of the semiconductor memory device according to the embodiment.

FIG. 4 is a bandgap diagram showing the operation of the semiconductor memory device according to the embodiment.

In the embodiment, the alloy film 16 is formed by forming the ruthenium film 31 in the process shown in FIG. 2B, forming the hafnium oxide film 32 in the process shown in FIG. 2C, and by subsequently performing heat treatment in the process shown in FIG. 3A to alloy the ruthenium included in the ruthenium film 31 with the hafnium included in the hafnium oxide film 32. Thereby, because the ruthenium stabilizes, even though the hafnium oxide film 17 is formed on the alloy film 16 in the process shown in FIG. 3B, the diffusion into the hafnium oxide film 17 of the ruthenium included in the alloy film 16 can be suppressed. As a result, even in the case where the alloy film 16 is formed to be thin, the alloy film 16 can remain in the semiconductor memory device 1 that is ultimately manufactured.

In the case where the alloy film 16 remains, as shown in FIG. 4, electrons are stored in the alloy film 16 because, for the electrons, the energy level of the alloy film 16 is lower than the energy level of the insulating film 15 and the energy level of the hafnium oxide film 17. Therefore, when a programming voltage is applied using the control gate electrode CG as a positive electrode and the active area 12 as a negative electrode, the electrons that enter the silicon film 14 from the active area 12 via the tunneling insulating film 13 are scattered by the electrons stored in the alloy film 16 and lose energy. Thereby, the electrons can be prevented from impacting the IPD film 21 at high speed to damage the IPD film 21 or from passing through the IPD film 21 to become leak current. Also, the charge retention characteristics of the floating gate electrode FG improve because a high barrier can be formed between the alloy film 16 and the hafnium oxide film 17.

Further, in the embodiment, the hafnium oxide film 32 is formed; subsequently, alloying heat treatment is performed; and subsequently, the hafnium oxide film 17 is formed. Thereby, the crystal grain boundaries of the hafnium oxide at the interface between the hafnium oxide film 32 and the hafnium oxide film 17 are divided. This also suppresses the diffusion of the ruthenium.

Moreover, in the embodiment, the process of supplying the source-material gas of hafnium to the atmosphere and the process of evacuating the source-material gas of hafnium from the atmosphere are multiply repeated when depositing hafnium and oxygen by ALD in the process shown in FIG. 2C. Thereby, the hafnium atoms can be deposited densely at the front surface of the ruthenium film 31. This mechanism will now be described.

FIG. 5A to FIG. 5F are drawings that schematically show the behavior of hafnium being deposited on the ruthenium film in the embodiment.

FIG. 6A to FIG. 6D are drawings that schematically show the behavior of hafnium being deposited on the ruthenium film in a reference example.

Figures 5A, 5B, 5C, 5D:
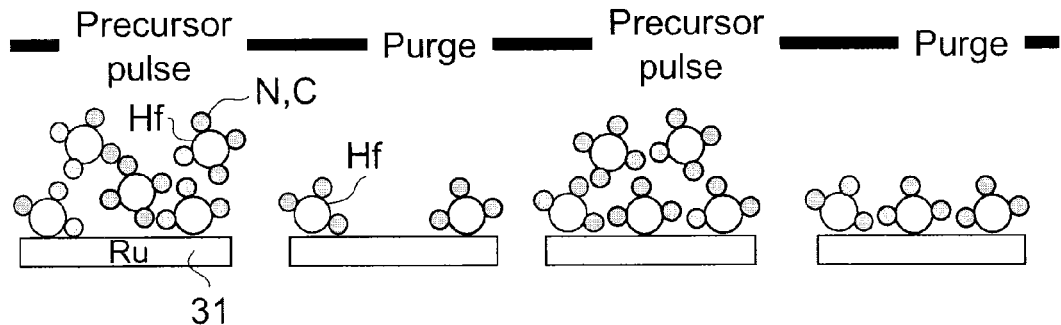
FIG. 5A to FIG. 5F are drawings that schematically show the behavior of hafnium being deposited on the ruthenium film in the embodiment.

When the source-material gas of hafnium is supplied to the atmosphere as shown in FIG. 5A, the hafnium atoms that initially reach the ruthenium film 31 adsorb to the ruthenium film 31. However, subsequently, because many molecules of the source-material gas accumulate and are loosely bonded to each other at the vicinity of the ruthenium film 31, steric hindrance undesirably occurs; and it becomes difficult for new hafnium atoms to adsorb to the ruthenium film 31.

Therefore, as shown in FIG. 5B, the source-material gas of hafnium is evacuated once from the atmosphere. Thereby, the source-material gas that had accumulated at the vicinity of the ruthenium film 31 also is evacuated. Then, as shown in FIG. 5C, the source-material gas again is supplied to the atmosphere. Thereby, hafnium atoms newly adsorb to the regions of the front surface of the ruthenium film 31 where the hafnium atoms have not yet adsorbed. By repeating this process, the steric hindrance can be avoided; and more hafnium atoms can adsorb to the ruthenium film 31.

Figures 5E, 5F:
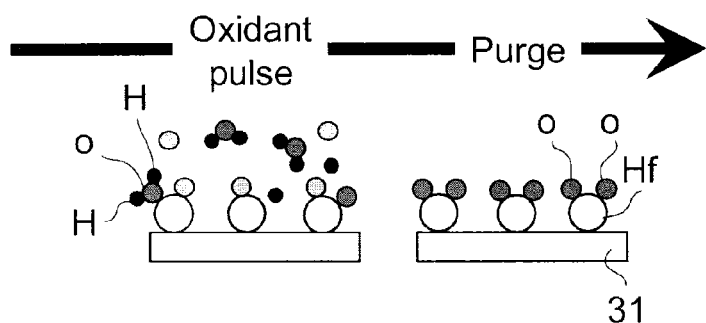
Figures 6A, 6B, 6C, 6D:
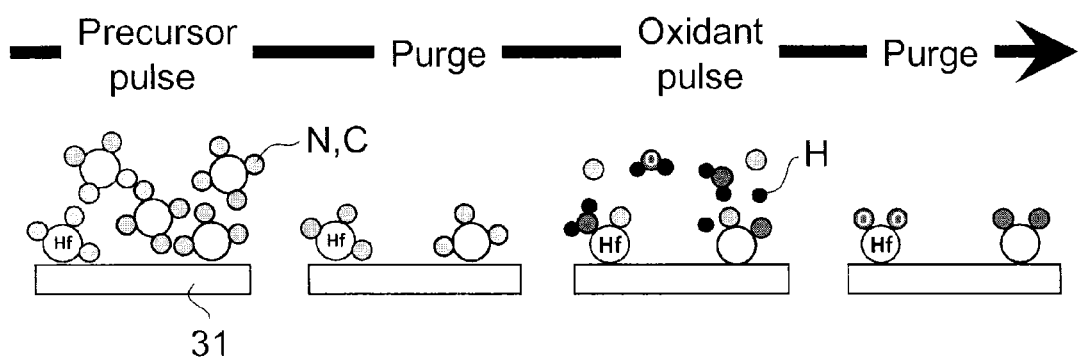
FIG. 6A to FIG. 6D are drawings that schematically show the behavior of hafnium being deposited on the ruthenium film in a reference example.

Then, the source-material gas of hafnium is evacuated again as shown in FIG. 5D; and an oxidative gas is supplied as shown in FIG. 5E. Thereby, as shown in FIG. 5F, it becomes easier for oxygen atoms that are supplied by the oxidative gas to adsorb to the hafnium atoms adsorbed to the ruthenium film 31 than to adsorb to the ruthenium film 31. Thus, more hafnium atoms can be bonded to the ruthenium film 31.

Conversely, in the case where the source-material gas of hafnium is supplied only once to the atmosphere as shown in FIG. 6A to FIG. 6D, it is difficult for the hafnium atoms to efficiently adsorb to the ruthenium film 31 due to the steric hindrance.

Test examples that illustrate the effects will now be described.

In the test examples, hafnium and oxygen were deposited on a ruthenium film by ALD. In this case, three samples having mutually-different patterns of supplying and evacuating the source-material gas of hafnium were made. Then, the ratio (the (Hf/O) ratio) of the intensity of the hafnium peak to the intensity of the oxygen peak was measured for these samples by analysis using X-ray photoelectron spectroscopy (XPS). The test results are shown in Table 1.

TABLE 1

| No. | Pattern of supplying and evacuating source-material gas | (Hf/O) ratio |
|---|---|---|
| 1 | 10 seconds supply → evacuate | 1.82 |
| 2 | 30 seconds supply → evacuate | 1.86 |
| 3 | (10 seconds supply → evacuate) × 3 repetitions | 2.06 |

As illustrated by No. 1 of Table 1, the (Hf/O) ratio was 1.82 in the case where the evacuation was performed after the source-material gas of hafnium was supplied for 10 seconds. As illustrated by No. 2, even in the case where the supply time of the source-material gas was 30 seconds, the (Hf/O) ratio was 1.86 and did not change much compared to the case of 10 seconds (No. 1). It may be conjectured that this is because, even though the supply of the source-material gas is continued for a long period of time, the newly-supplied source-material gas cannot easily approach the ruthenium film due to the steric hindrance. However, as illustrated by No. 3, although the total supply time for when the supply of the source-material gas for 10 seconds and the evacuation of the source-material gas are repeated 3 times is the same as that of No. 2, the (Hf/O) ratio increased greatly to become 2.06. It is considered that this is because, as described above, the steric hindrance was eliminated each time the evacuation of the source-material gas was performed; and more hafnium atoms could approach the ruthenium film.

A comparative example will now be described.

Figure 7A:
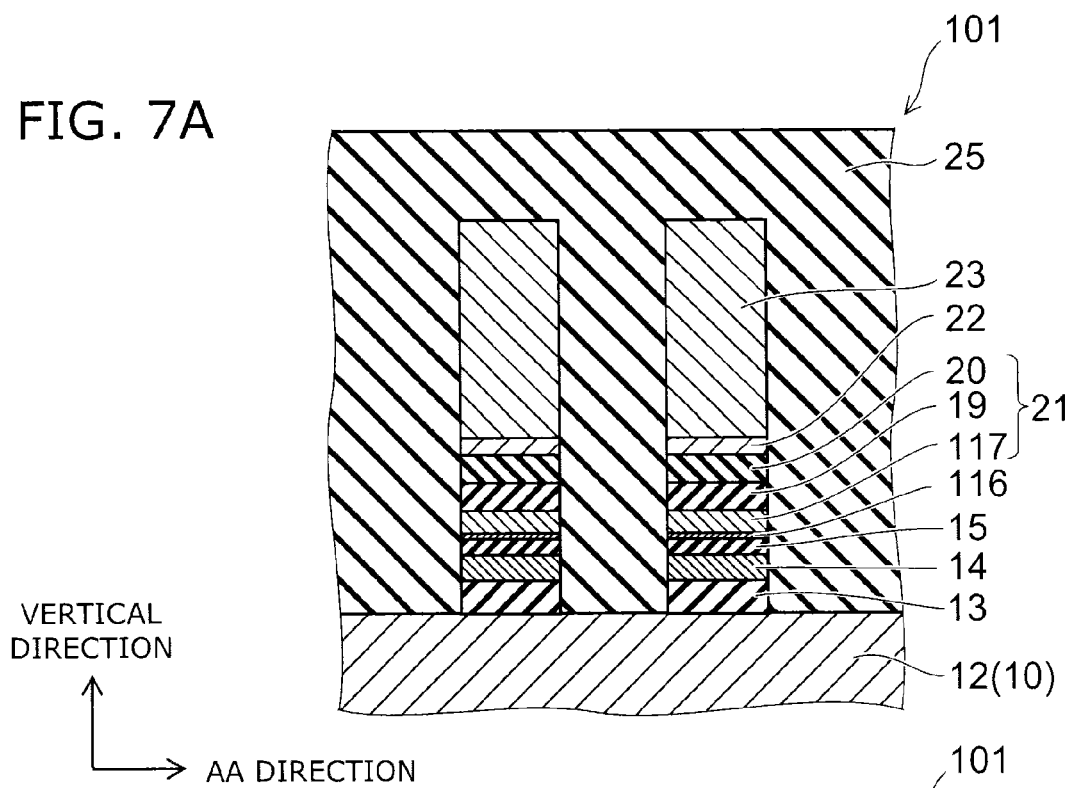
FIG. 7A and FIG. 7B are cross-sectional views showing a semiconductor memory device according to a comparative example.
Figure 7B:
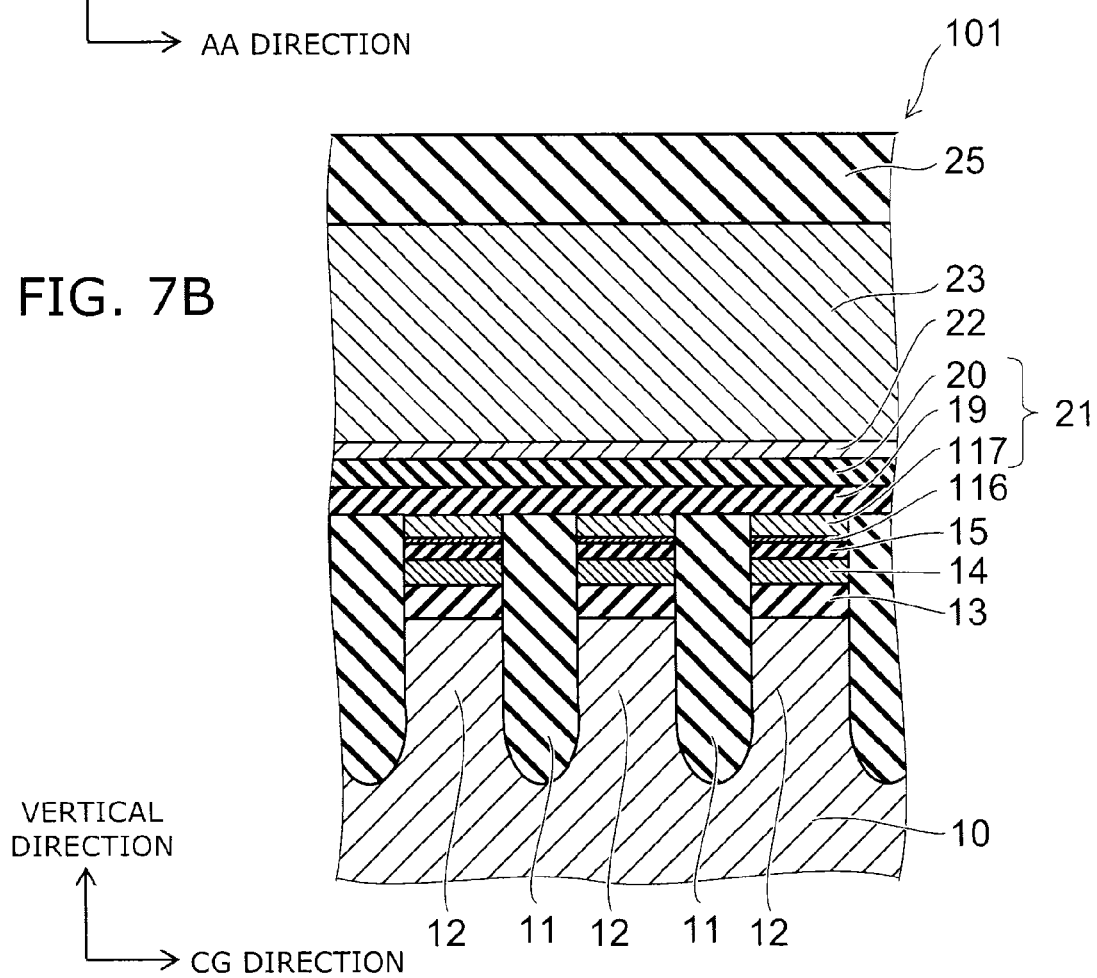

FIG. 7A and FIG. 7B are cross-sectional views showing a semiconductor memory device according to the comparative example.

Figure 8A:
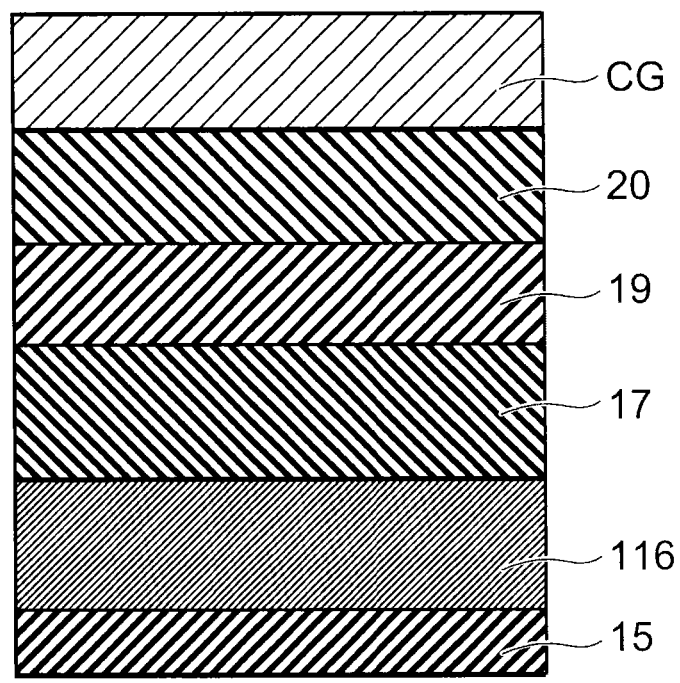
FIG. 8A is a drawing showing the film structure to be formed in the comparative example.
Figure 8B:
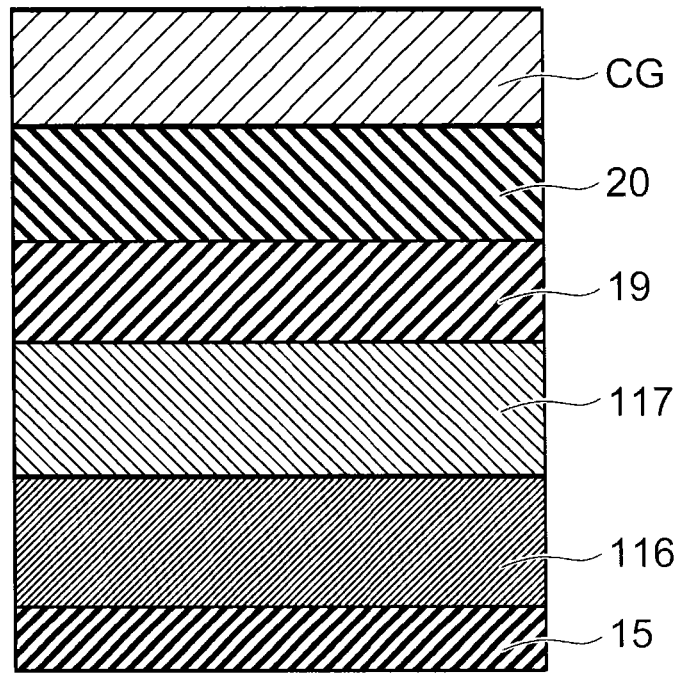
FIG. 8B is a drawing showing the film structure that is actually formed.

FIG. 8A is a drawing showing the film structure to be formed in the comparative example; and FIG. 8B is a drawing showing the film structure that is actually formed.

In the semiconductor memory device 101 according to the comparative example as shown in FIG. 7A and FIG. 7B, compared to the semiconductor memory device 1 (referring to FIG. 1A and FIG. 1B) according to the embodiment, a ruthenium film 116 made of simple ruthenium is provided instead of the alloy film 16. Also, a ruthenium-containing hafnium oxide film 117 is provided instead of the hafnium oxide film 17. The crystal structure of the ruthenium film 116 is a hexagonal structure.

As shown in FIG. 8A, the comparative example attempts to form the hafnium oxide film 17 that has a high dielectric constant and substantially does not include ruthenium by depositing hafnium and oxygen after ruthenium is deposited on the insulating film 15 to form the ruthenium film 116.

However, actually, as shown in FIG. 8B, when hafnium and oxygen are deposited on the ruthenium film 116, the ruthenium atoms that are included in the ruthenium film 116 undesirably mix into the newly deposited hafnium oxide. Thereby, the ruthenium-containing hafnium oxide film 117 is undesirably formed on the ruthenium film 116. Moreover, in the case where heat treatment is performed for some purpose after the hafnium oxide is deposited, the ruthenium atoms diffuse into the hafnium oxide even more.

Although the reason that such a phenomenon occurs is not apparent, the reason may be inferred to be, for example, as follows. Namely, there is a possibility that the ruthenium atoms may immediately diffuse undesirably into the hafnium oxide when the hafnium oxide is deposited on the ruthenium film 116; and the ruthenium atoms may be moving to follow the deposition surface of the hafnium oxide. There is also a possibility that, when ruthenium oxide ($RuO_4$) is formed by the ruthenium film 116 bonding with oxygen, the ruthenium oxide ($RuO_4$) is emitted to the atmosphere because the ruthenium oxide ($RuO_4$) is a gas; and the ruthenium oxide ($RuO_4$) is deposited again with the hafnium oxide. Further, in the case where heat treatment is performed after the hafnium oxide is deposited, it may be conjectured that the ruthenium atoms diffuse via the crystal grain boundaries of the hafnium oxide.

In any case, because the dielectric constant decreases in the case where the ruthenium mixes into the hafnium oxide, it becomes difficult for the IPD film 21 to impede the movement of the electrons; and the leak current increases. In the case where the IPD film 21 is formed to be thick to compensate this, the aspect ratio when forming the gate stacked body 24 undesirably increases; and the patterning becomes difficult. Moreover, the drive voltage of the semiconductor memory device increases.

Conversely, according to the embodiment, prior to depositing the hafnium oxide film 17 on the ruthenium film 31, the hafnium oxide film 32 that has a proportion of hafnium to oxygen that is higher than that of the hafnium oxide film 17 is formed; and the ruthenium is alloyed with the hafnium. Thereby, the ruthenium stabilizes and does not easily enter the hafnium oxide film 17. As a result, the characteristics can be realized as designed without the dielectric constant of the IPD film 21 decreasing.

Although an example is illustrated in the embodiments described above in which ruthenium is used as the metal other than hafnium that is used to form the alloy film 16, this is not limited thereto; and any metal may be used. However, to sufficiently obtain the effect of forming the barrier described above, it is favorable for the metal to be a so-called p-type metal that has a work function closer to the valence band of silicon than to the conduction band of silicon. For example, other than the ruthenium described above, iridium (Ir) may be used as such a metal.

Also, although an example is illustrated in the embodiments described above in which a three-layer film made of the hafnium oxide film 17, the silicon oxide film 19, and the hafnium oxide film 20 is used as the IPD film 21, this is not limited thereto; and, for example, an aluminum oxide film (an $Al_2O_3$ film) may be used instead of the silicon oxide film 19.

Further, nitriding of the alloy film 16 may be performed in the process shown in FIG. 3A.

According to the embodiments described above, a semiconductor memory device and a method for manufacturing the semiconductor memory device having good charge retention characteristics even when downscaled can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor memory device, comprising:
    forming a first insulating film on a semiconductor substrate;
    forming a silicon film including silicon on the first insulating film;
    forming a second insulating film on the silicon film;
    forming a metal film on the second insulating film by depositing a metal other than hafnium;
    depositing hafnium and oxygen on the metal film;
    forming a hafnium alloy-containing film by alloying the metal and the hafnium by performing heat treatment;
    forming a third insulating film on the hafnium alloy-containing film; and
    forming an electrode on the third insulating film.

2. The method for manufacturing the semiconductor memory device according to claim 1, wherein the heat treatment heats to a temperature not less than the crystallization temperature of hafnium.

3. The method for manufacturing the semiconductor memory device according to claim 1, wherein the depositing of hafnium and oxygen is performed by atomic layer deposition.

4. The method for manufacturing the semiconductor memory device according to claim 3, wherein the depositing of hafnium includes:
    supplying a source-material gas of hafnium to an atmosphere;
    evacuating the source-material gas of hafnium from the atmosphere;
    again supplying a source-material gas of hafnium to the atmosphere after the evacuating;
    again evacuating the source-material gas of hafnium from the atmosphere; and
    supplying an oxidative gas to the atmosphere.

5. The method for manufacturing the semiconductor memory device according to claim 1, wherein
    the forming of the third insulating film includes depositing a first hafnium oxide film, and
    a proportion of hafnium to oxygen in a second hafnium oxide film deposited in the depositing of hafnium and oxygen on the metal film is higher than a proportion of hafnium to oxygen in the first hafnium oxide film.

6. The method for manufacturing the semiconductor memory device according to claim 1, wherein the metal is a metal having a work function closer to the valence band of silicon than to the conduction band of silicon.

7. The method for manufacturing the semiconductor memory device according to claim 1, wherein the metal is at least one type of metal selected from the group consisting of ruthenium and iridium.

* * * * *